(12) United States Patent
Kanegae et al.

(10) Patent No.: US 8,816,478 B2
(45) Date of Patent: Aug. 26, 2014

(54) SEMICONDUCTOR DEVICE HAVING PENETRATION ELECTRODE PENETRATING THROUGH SEMICONDUCTOR SUBSTRATE (71) Applicant: Elpida Memory, Inc., Tokyo (JP)

(72) Inventors: Yoshiharu Kanegae, Hitachi (JP); Hisashi Tanie, Hitachi (JP); Mitsuhisa Watanabe, Tokyo (JP); Keiyo Kusanagi, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/736,652

(22) Filed: Jan. 8, 2013

(65) Prior Publication Data
US 2013/0181345 A1 Jul. 18, 2013

(30) Foreign Application Priority Data
Jan. 10, 2012 (JP) ................. 2012-002210

(51) Int. Cl.
*H01L 29/40* (2006.01)
(52) U.S. Cl.
USPC .................... 257/621; 257/774; 257/E21.597

(58) Field of Classification Search
USPC .......... 257/621, 774, E21.597; 438/629, 630, 438/637–640, 668, 672, 675
See application file for complete search history.

(56) References Cited

U.S. PATENT DOCUMENTS 8,304,877 B2   11/2012  Fujii
2008/0153286 A1*  6/2008  Sunohara et al. ............. 438/667

FOREIGN PATENT DOCUMENTS

JP   2000-311982 A   11/2000
JP   2010-161102 A   7/2010

* cited by examiner

*Primary Examiner* — Jasmine Clark
(74) *Attorney, Agent, or Firm* — Foley & Lardner LLP (57) ABSTRACT Disclosed herein is a device that includes: a semiconductor substrate having a first surface on which a plurality of circuit elements are formed and a second surface opposite to the first surface; an insulating layer covering the second surface of the semiconductor substrate; and a penetration electrode having a body section that penetrates through the semiconductor substrate and a protruding section that is connected to one end of the body section and protrudes from the second surface of the semiconductor substrate. The second surface of the semiconductor substrate is covered with the protruding section of the penetration electrode without intervention of the insulating layer.

20 Claims, 10 Drawing Sheets

SEMICONDUCTOR DEVICE HAVING PENETRATION ELECTRODE PENETRATING THROUGH SEMICONDUCTOR SUBSTRATE

BACKGROUND OF THE INVENTION

1. Field of the Invention

The present invention relates to a semiconductor device, and more particularly relates a semiconductor device having a penetration electrode penetrating through a semiconductor substrate.

2. Description of Related Art

A semiconductor device including a plurality of semiconductor chips stacked with one another is generally referred to as a COC (Chip-on-Chip) device. The COC device is efficient in implementation due to small in size, and can make the length of lines between chips very short. Therefore, such structure is employed particularly in semiconductor devices such as memory modules, which are required to be small in size and at low costs. In a COC type semiconductor device as disclosed in Japanese Patent Application Laid-Open No. 2000-311982, through-holes are so provided as to pass through semiconductor chips. In the through-holes, a conductive layer is formed. Moreover, on a top and a back surface thereof, electrode pads (bumps) are formed, respectively. A plurality of semiconductor chips are stacked in a semiconductor device. As a result, via the conductive layer (so-called penetrating electrode) in a through-hole and the electrode pad (bump), an upper and lower semiconductor chips are electrically connected.

In a semiconductor device stacked with a plurality of semiconductor chips and provided with penetrating electrodes, the chips could be warped due to thermal stress during implementation. Japanese Patent Application Laid-Open No. 2010-161102 discloses the structure aimed at curbing an impact of such warping.

However, the above-described conventional techniques can cause plastic deformation of electrodes, the details of which will be described later, during stacking, heating and pressing. As a result, the positions of chips in a bump joint section may change and electrical connection troubles between the semiconductor chips may occur. Further, the warping of chips by thermal stress can cause a resin material (called as "underfill"), which fills the gaps between the chips, to separate from the chips.

SUMMARY

In one embodiment, there is provided a semiconductor device that includes: a semiconductor substrate having a first surface on which a plurality of circuit elements are formed and a second surface opposite to the first surface; an insulating layer covering the second surface of the semiconductor substrate; and a penetration electrode having a body section that penetrates through the semiconductor substrate and a protruding section that is connected to one end of the body section and protrudes from the second surface of the semiconductor substrate. The second surface of the semiconductor substrate is covered with the protruding section of the penetration electrode without intervention of the insulating layer.

In another embodiment, there is provided a semiconductor device that includes: a semiconductor substrate having first and second surfaces opposite to each other; a penetration electrode penetrating through the semiconductor substrate between the first and second surfaces; a bump electrode connected to one end of the penetration electrode; and an insulating layer. The first surface of the semiconductor substrate includes a first area surrounding the one end of the penetration electrode, a second area surrounding the first area and a third area surrounding the second area. The first area is covered with the bump electrode, the third area is covered with the insulating layer, and the second area is covered with neither the bump electrode nor the insulating layer.

In still another embodiment, there is provided semiconductor device that includes: a semiconductor substrate including a first surface and a second surface opposite to the first surface; a penetration electrode penetrating from the first surface to the second surface; a first bump electrode provided over the first surface of the semiconductor substrate, the first bump electrode being electrically coupled to the penetration electrode; a first insulating layer provided over the first surface of the semiconductor substrate so that the first insulating layer is apart from the first bump electrode; a second bump electrode provided over the second surface of the semiconductor substrate, the second bump electrode being electrically coupled to the penetration electrode; and a second insulating layer provided over the second surface of the semiconductor substrate so that the second insulating layer is apart from the second bump electrode.

DETAILED DESCRIPTION OF THE EMBODIMENTS

Preferred embodiments of the present invention will be explained below in detail with reference to the accompanying drawings.

Figure 1:
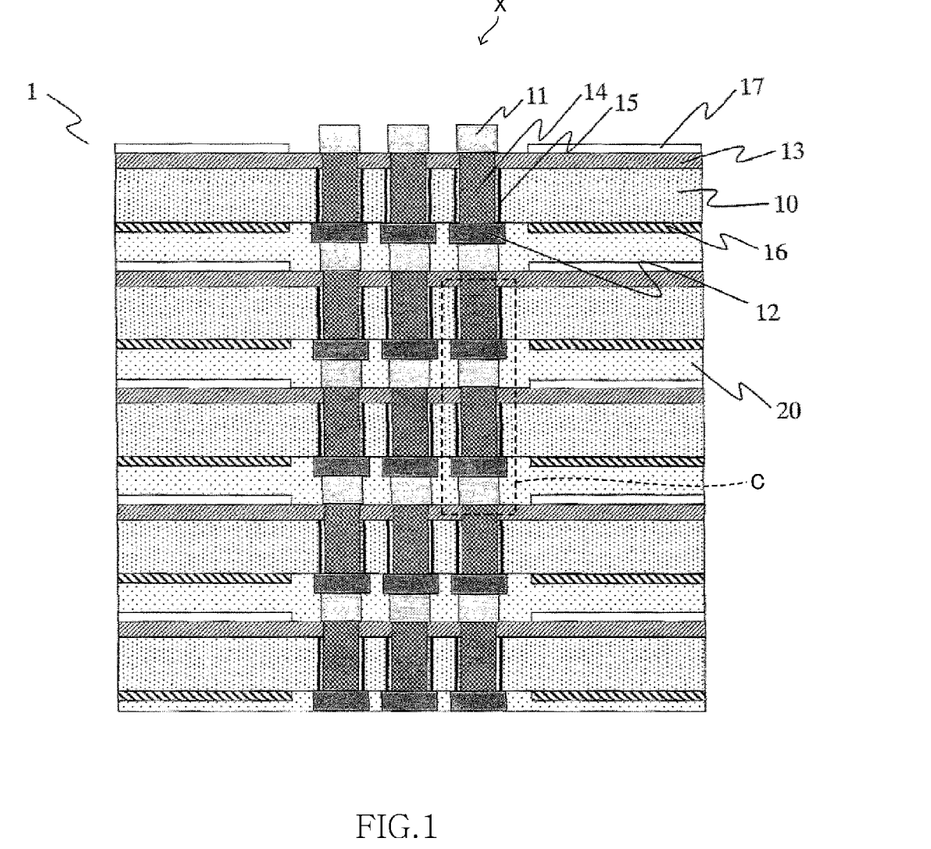
FIG. 1 is a schematic cross-sectional view of a semiconductor device according to an embodiment of the present invention.

As shown in FIG. 1, a semiconductor device 1 according to the embodiment of the present invention includes five semiconductor chips 10, which are made from silicon substrates. For example, thickness of the semiconductor chip 10 is several tens of micrometers. For example, the plane size of the semiconductor chips 10 is several millimeters×several millimeters. The semiconductor chip 10 includes upper bumps 11 on an upper surface and lower bumps 12 on a lower surface. The five semiconductor chips 10 are stacked in such a way that the lower bumps 12 of an upper semiconductor chip 10 are joined to the upper bumps 11 of a lower semiconductor chip 10 via a solder layer, which is not shown in the diagram. The gaps between the upper and lower semiconductor chips 10 that are adjacent to each other are filled with a resin material 20 known as so-called underfill. The actual semiconductor device 1 is mounted on a substrate called interposer, which is equipped with solder balls for connection to a mounting board. On the interposer, the semiconductor device 1 is then encircled by and covered with mold resin. However, such a structure is not shown in FIG. 1.

Figure 2:
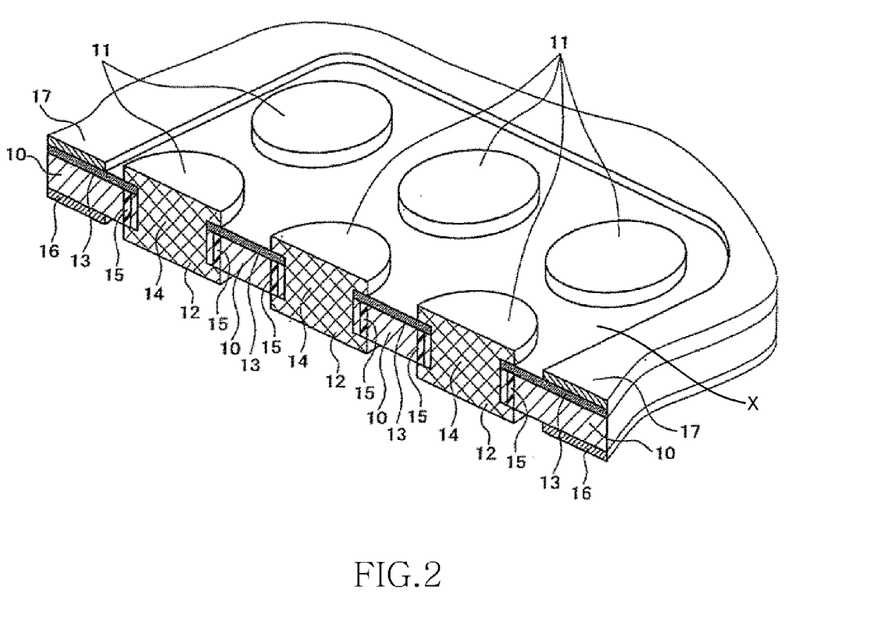
FIG. 2 shows upper bumps provided on an upper surface of the semiconductor chip shown in FIG. 1.

As shown in FIGS. 1 and 2, a circuit pattern section 13 is formed on an upper surface of the semiconductor chip 10. In the circuit pattern section 13, desired circuit elements and wiring patterns are formed. Above the circuit pattern section 13, a resin layer 17 such as polyimide is disposed so as to increase the adhesion to the underfill 20. In each semiconductor chip 10, a conductive bump placement area X is provided in order to connect chips electrically (and between the chips and the outside). In the conductive bump placement area X, a plurality of (or three in the cross-sectional view of FIG. 1) penetrating electrodes 14 are formed. On an, upper and a lower end of each penetrating electrode 14, an upper bump 11 and a lower bump 12 are so formed as to cover the surfaces of the penetrating electrode 14. Incidentally, reference numeral 15, shown in FIGS. 1 and 2, represents an insulating material, or so-called insulating ring, passing through each semiconductor chip 10 and the insulating material 15 is in the shape of a tube (e.g., in a cylindrical shape) that encircles the periphery of a penetrating electrode 14. In FIG. 2, the upper bumps 11 are shown in the shape of a cylinder (circular disc). However, the upper bumps 11 may be in other shapes, such as a shape of a square pole or hexagonal column. Similarly, the lower bumps 12 and the penetrating electrodes 14 may be in other shapes, such as a shape of a cylinder, square pole, or hexagonal column.

In a lower section (back surface) of each semiconductor chip 10, a so-called back-surface resin layer 16 is disposed. The back-surface resin layer 16 is a resin layer curbs warping of chips by thermal stress during implementation process, and improves the adhesion between the semiconductor chips 10 and the underfill 20. Incidentally, for example, the back-surface resin layer 16 is made from resin such as polyimide. According to the present embodiment, the back-surface resin layer 16 covers any area other than an area where the lower pumps 12 are formed and a surrounding area thereof. That is, in planar view, the back-surface resin layer 16 is formed away from the periphery of the lower bump 12.

Figure 3A:
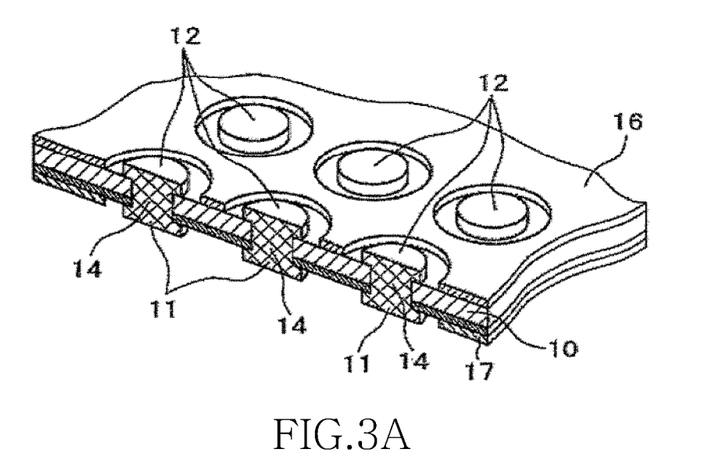
FIGS. 3A and 3B show lower bumps provided on a lower surface of the semiconductor chip shown in FIG. 1.
Figure 3B:
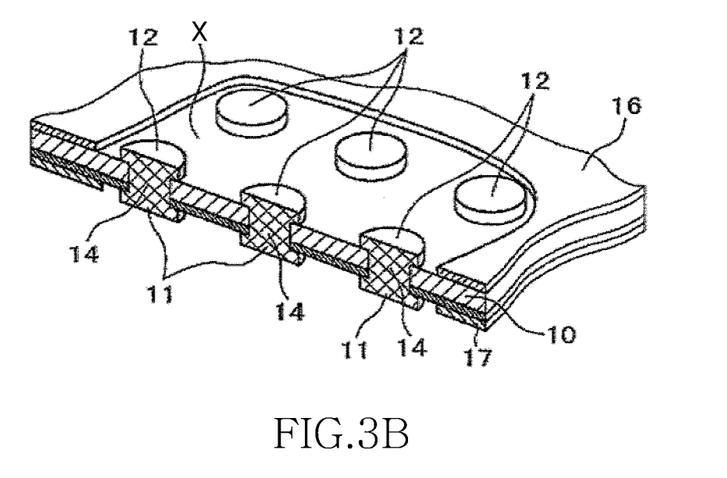

More specifically, as shown in FIG. 3A, on the back surface of the semiconductor chip 10, the back-surface resin layer 16 may encircles the penetrating electrodes 11 with a predetermined distance away therefrom. Alternatively, as shown in FIG. 3B, the back-surface resin layer 16 may be formed in an area that excludes the conductive bump placement area X. In FIGS. 3A and 3B, the lower surface of the chip is turned upward, with no insulating ring 15 shown.

In case there is no back-surface resin layer 16, the semiconductor chip 10 is so warped as to protrude downward due to thermal stress as the temperature is cooled during the implementation process from a high-temperature atmosphere to a normal temperature because the liner-expansion coefficients of the circuit pattern section 13 and resin layer 17, which are provided in an upper section of the chip, are larger than the liner expansion coefficient of the main body (silicon or the like) of the semiconductor chip 10. According to the present embodiment, the back-surface resin layer 16 with large liner-expansion coefficient is disposed on the back surface of the chip, thereby curbing the warping.

Figure 4:
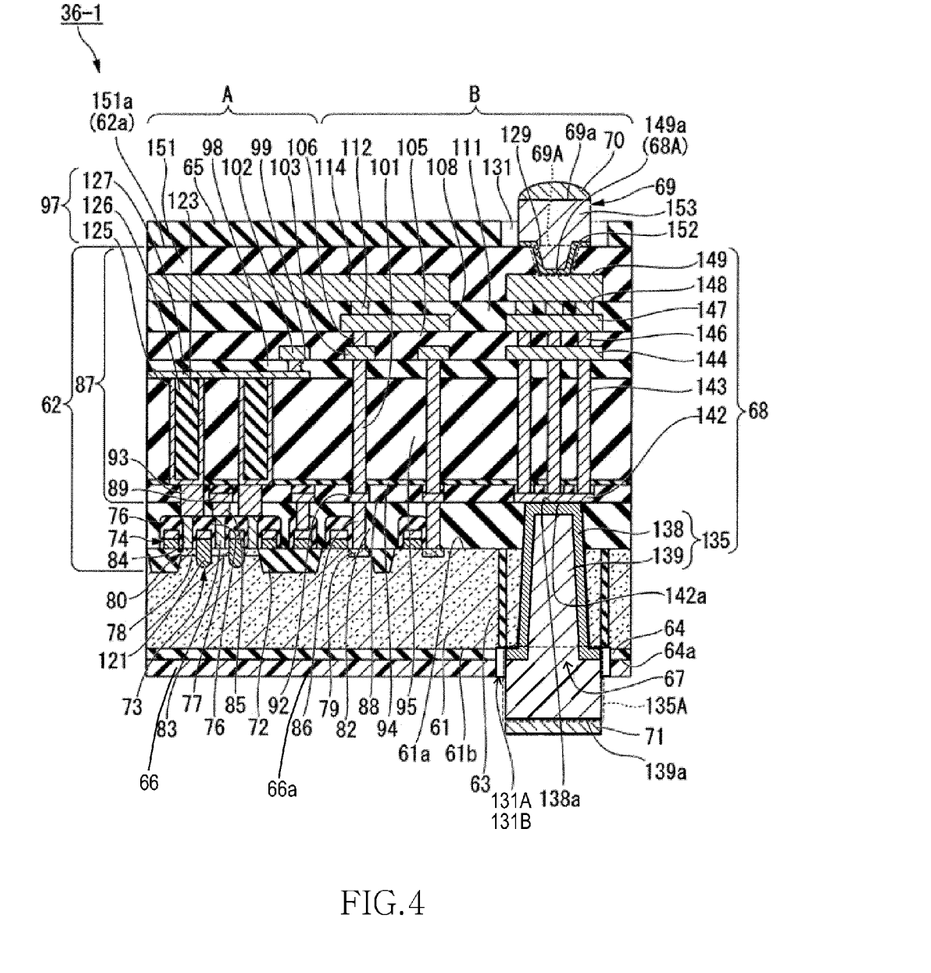
FIG. 4 is a detailed cross-sectional view of one of the semiconductor chips shown in FIG. 1.

Turning to FIG. 4, the semiconductor chip 10 includes a semiconductor substrate 61, which is made from semiconductor materials such as single-crystal silicon. The semiconductor substrate 61 has a first surface 61a, and a second surface 61b which is disposed on the opposite side of the semiconductor substrate 61 from the first surface 61a. On the first surface 61a's side, a groove 121 with a gate insulating film (not shown) and part of a gate electrode 73 is formed. The groove 121 is provided in a memory cell formation area A.

On the first surface 61a, a circuit element layer 62 is provided. The circuit element layer 62 includes the memory cell formation area A, in which a memory cell is formed, and a peripheral circuit formation area B in which peripheral circuits are formed. The circuit element layer 62 also includes an element separation area 72; a gate oxide film (not shown), which is formed on the first surface 61a of the semiconductor substrate 61; gate electrodes 73 and 74; sidewall 76; a first impurity diffused layer 77; a second impurity diffused layer 78; a third impurity diffused layer 79; a transistor 80; a first interlayer insulating film 82; self-aligned contacts 83 and 84; a bit-line contact 85; a contact plug 86; and a multi-level wiring structure 87.

The element separation area 72 is provided on the first surface 61a's side of the semiconductor substrate 61. The element separation area 72 is so formed that an insulating film (e.g. silicon dioxide film ($SiO_2$ film)) is embedded in a groove formed in the semiconductor substrate 61.

The gate electrode 73 is so provided as to be embedded in the groove 121 formed on the semiconductor substrate 61 via a gate insulating film (not shown), and to protrude from the first surface 61a. The gate electrode 73 is a two-layer structure, in which a polysilicon film and a tungsten film are sequentially stacked.

The gate electrode 74 is positioned next to the gate electrode 73. The gate electrode 74 is provided on the first surface 61a in the memory cell formation area A via a gate insulating film (not shown). The sidewall 76 covers the side and upper surfaces of the gate electrodes 72 and 73. For the sidewall 76, a silicon nitride film (SiN film) is available.

The first impurity diffused layer 77 rmed between the gate electrodes 73. The second impurity diffused layer 78 is formed between the gate electrodes 73 and 74. In case the semiconductor substrate 61 is a p-type single-crystal silicon substrate, the first and second impurity diffused layers 77 and 78 are made by ion implantation of n-type impurity into the semiconductor substrate 61.

The transistor 80 includes a gate insulating film (not shown), the gate electrode 73, the first impurity diffused layer 77, and the second impurity diffused layer 78. The third impurity diffused layer 79 is formed on the first surface 61a's side of the semiconductor substrate 61 in the peripheral circuit area B. The third impurity diffused layer 79 is one of components of a peripheral-circuit transistor (not shown).

The first interlayer insulating film 82 is provided on the first surface 61a and the element separation area 72 in such a way as to cover the sidewall 76. The first interlayer insulating film 82 is disposed in the memory cell formation area A and the peripheral circuit formation area B. For the first interlayer insulating film 82, for example, a silicon dioxide film ($SiO_2$ film) is available.

The self-aligned contact 83 passes through the first interlayer insulating film 82 on the first impurity diffused layer 77. A lower end of the self-aligned contact 83 is in contact with the first impurity diffused layer 77. In this manner, the self-aligned contact 83 is electrically connected to the first impurity diffused layer 77.

The self-aligned contact 84 passes through the first interlayer insulating film 82 on the second impurity diffused layer 78. A lower end of the self-aligned contact 84 is in contact with the second impurity diffused layer 78. In this manner, the self-aligned contact 84 is electrically connected to the second impurity diffused layer 78.

The bit-line contact 85 is disposed on the self-aligned contact 83, and is provided in the first interlayer insulating film 82. The contact plug 86 passes through the first interlayer insulating film 82 on the third impurity diffused layer 79. A lower end of the contact plug 86 is in contact with the third impurity diffused layer 79. In this manner, the contact plug 86 is electrically connected to the peripheral-circuit transistor (no shown).

The multi-level wiring structure 87 includes: a second interlayer insulating film 88; a hit line 89; wiring layers 92, 102, 103, 108, 114, 142, 144, and 147 and a first wiring layer 149, which are a plurality wiring layers; a capacitance contact 93; a stopper film 94; a third interlayer insulating film 95; a capacitor 97; a fourth interlayer insulating film 98; vias 99, 106, 112, 146, and 148; contact plugs 101 and 143; a fifth interlayer insulating film 105; a sixth interlayer insulating film 111; and a second surface insulating layer 151. Among the above components, the wiring layers 142, 144, and 147, the contact plug 143, the vias 146 and 148, and the first wiring layer 149 constitute part of a chip penetrating via 68.

The second interlayer insulating film 88 is provided on the first interlayer insulating film 82. The second interlayer insulating film 88 is disposed in the memory cell formation area A and the peripheral circuit formation area B. For the second interlayer insulating film 88, a silicon oxide film ($SiO_2$ film) is available. The bit line 89 is provided on the bit-line contact 85, and is provided in the second interlayer insulating film 88. The bit line 89 is electrically connected to the first impurity diffused layer 77 via the bit-line contact 85. Although not shown in the diagram, the bit line 89 extends in a direction that crosses a direction in which the gate electrode 73 extends.

The wiring layer 92 is provided on the first interlayer insulating film 82, and is connected to an upper end of the contact plug 86. In this manner, the wiring layer 92 is electrically connected to the peripheral-circuit transistor (not shown) via the contact plug 86.

The capacitance contact 93 passes through the first and second interlayer insulating films 82 and 88 in an area above the self-aligned contact 84. A lower end of the capacitance contact 93 is connected to an upper end of the self-aligned contact 84. In this manner, the capacitance contact 93 is electrically connected to the second impurity diffused layer 78 via the self-aligned contact 84.

The stopper film 94 is provided on the second interlayer insulating film 88. The stopper film 94 is disposed in the memory cell formation area A and the peripheral circuit formation area B. The stopper film 94 serves as an etching stopper at a time when a cylinder hole 123 is formed by etching so as to allow the capacitor 97 to be placed on the third interlayer insulating film 95. For the stopper film 94, a silicon nitride (SiN film) is used.

The third interlayer insulating film 95 is provided on the stopper film 94, and has the cylinder hole 123 through which an upper surface of the capacitance contact 93 is exposed. The cylinder hole 123 passes through the third interlayer insulating film 95. The third interlayer insulating film 95 is disposed in the memory cell formation area A and the peripheral circuit formation area B. For the third interlayer insulating film 95, a silicon dioxide film ($SiO_2$ film) is available.

The capacitor 97 includes a lower electrode 125, which covers an inner surface of the cylinder hole 123; a capacitance insulating film 126, which is embedded in the cylinder hole 123 via the lower electrode 125; and an upper electrode 127, which is provided on the third interlayer insulating film 95 and which is connected to an upper end of the lower electrode 125 and an upper end of the capacitance insulating film 126.

The lower electrode 125 is in contact with the capacitance contact 93. Therefore, the lower electrode 125 is electrically connected to the second impurity diffused layer 78 via the capacitance contact 93. The upper electrode 127 is a common electrode for a plurality of lower electrodes 125. Data held by the capacitor 97 are read into the hit line 89 via the first impurity diffused layer 77, the self-aligned contact 83, the bit-line contact 85, and the capacitance contact 93, as the gate electrode 73, which functions as a word line, becomes activated.

The fourth interlayer insulating film 98 is provided on the third interlayer insulating film 95 so as to cover the upper electrode 127. The fourth interlayer insulating film 98 is disposed in the memory cell formation area A and the peripheral circuit formation area B. For the fourth interlayer insulating film 98, for example, a silicon dioxide film ($SiO_2$ film) is available.

The via 99 passes through the fourth interlayer insulating film 98, which is positioned on the upper electrode 127. A lower end of the via 99 is connected to the upper electrode 127. The contact plug 101 passes through the stopper film 94, which is positioned on the wiring layer 92, the third interlayer insulating film 95, and the fourth interlayer insulating film 98. A lower end of the contact plug 101 is connected to the wiring layer 92.

The wiring layer 102 is provided on the fourth interlayer insulating film 98, and is connected to an upper end of the via 99. In this manner, wiring layer 102 is electrically connected to the upper electrode 127 via the via 99. The ng layer 102 supplies a predetermined potential to the upper electrode 127. The wiring layer 103 is provided on the fourth interlayer insulating film 98, and is connected to an upper end of the contact plug 101.

The fifth interlayer insulating film 105 is provided on the fourth interlayer insulating film 98 so as to cover the wiring layers 102 and 103. The fifth interlayer insulating film 105 is disposed in the memory cell formation area A and the peripheral circuit formation area B. For the fifth interlayer insulating film 105, for example, a silicon dioxide film ($SiO_2$ film) is available.

The via 106 passes through the fifth interlayer insulating film 105, which is positioned on the wiring layer 103. A lower end of the via 106 is connected to the wiring layer 103. The wiring layer 108 is provided on the fifth interlayer insulating film 105, and is connected to an upper end of the via 106.

The sixth interlayer insulating film 111 is provided on the fifth interlayer insulating film 105 so as to cover the wiring layer 108. The sixth interlayer insulating film 111 is disposed in the memory cell formation area A and the peripheral circuit formation area B. For the sixth interlayer insulating film 111, for example, a silicon oxide film ($SiO_2$ film) is available.

The via 112 passes through the sixth interlayer insulating film 111, which is positioned on the wiring layer 108. The wiring layer 114 is provided on the sixth interlayer insulating film 111, and is connected to an upper end of the via 112. The wiring layer 114 is on the top layer.

The wiring layer 142 is disposed on the first interlayer insulating film 82 that is provided in the peripheral circuit formation area B. Part of a lower surface 142a of the wiring layer 142 is exposed through a substrate through-hole 67. The lower surface 142a is connected to an upper surface 138a of a seed layer 138, which is provided in the substrate through-hole 67. In this manner, the wiring layer 142 is electrically connected to a penetrating electrode 135.

A plurality of contact plugs 143 passes through the second interlayer insulating film 88, which is positioned on the wiring layer 142, the stopper film 94, the third interlayer insulating film 95, and the fourth interlayer insulating film 98. Lower ends of a plurality of contact plugs 143 are connected to an er surface of the wiring layer 142. In this manner, a plurality of contact plugs 143 are electrically connected to the wiring layer 142.

The wiring layer 144 is provided on an upper surface of the fourth interlayer insulating film 98 that is positioned in the peripheral circuit area B. A lower surface of the wiring layer 144 is connected to upper ends of a plurality of contact plugs 143. In this manner, the wiring layer 144 is electrically connected to a plurality of contact plugs 143. A plurality of vias 146 passes through the fifth interlayer insulating film 105 on the wiring layer 144. Lower ends of a plurality of vias 146 are connected to the wiring layer 144. In this manner, a plurality of vias 146 are electrically connected to the wiring layer 144.

The wiring layer 147 is provided on an upper surface of the fifth interlayer insulating film 105 that is positioned in the peripheral circuit area B. A lower surface of the wiring layer 147 is connected to upper ends of a plurality of vias 146. In this manner, the wiring layer 147 is electrically connected to a plurality of vias 146. A plurality of vias 148 passes through the sixth interlayer insulating film 111 on the wiring layer 147. Lower ends of a plurality of vias 148 are connected to the wiring layer 147. In this manner, a plurality of vias 148 are electrically connected to the wiring layer 147.

The first wiring layer 149 is provided on an upper surface of the sixth interlayer insulating film 111 that is positioned in the peripheral circuit area B. A lower surface of the first wiring layer 149 is connected to upper ends of a plurality of vias 148. In this manner, the first wiring layer 149 is electrically connected to a plurality of vias 148. Part of an upper surface 149a of the first wiring layer 149 (or one end 68A of the chip penetrating electrode 68) is exposed through an opening 129, which is formed in the second surface insulating layer 151. The first wiring layer 149 is disposed on the top layer, among a plurality of wiring layers that make up the multi-level wiring structure 87.

The second surface insulating layer 151 is provided on the sixth interlayer insulating film 111 in such a way as to cover the wiring layer 114 on the top layer, and the first wiring layer 149. The second surface insulating layer 151 includes the opening 129 to expose one end 68A of the chip penetrating electrode 68. The second surface insulating layer 151 has a function of protecting a portion of the multi-level wiring structure 87 that is disposed below the second surface insulating layer 151. More specifically, the second surface insulating layer 151 prevents water from getting into the multi-level wiring structure 87. For the second surface insulating layer 151, a silicon nitride film ($Si_3N_4$ film), an oxynitride film (SiON film), or the like can be used.

A cylindrical insulating material 63 (insulating ring) encircles the penetrating electrode 135. The cylindrical insulating material 63 passes through the semiconductor substrate 61 in the peripheral circuit formation area B. The cylindrical insulating material 63 is made by filling the groove with an insulating film (e.g. a silicon nitride film (SiN film), a silicon oxide film ($SiO_2$ film), and the like). In FIG. 4, there is described an example in which one cylindrical insulating material 63 is provided for one chip penetrating electrode 68. However, for one chip penetrating electrode 68, two cylindrical insulating materials may be disposed concentrically.

A first back-surface insulating layer 64 covers the second surface 61b of the semiconductor substrate 61. For the first back-surface insulating layer 64, for example, a silicon nitride film (SiN film) may be used. The first back-surface insulating layer 64 includes an opening 131A, which is designed to expose an one-end portion 135A of the penetrating electrode 135 and a surrounding area thereof. Accordingly, the one-end portion 135A of the penetrating electrode 135 and the surrounding area thereof are net covered with the first back-surface insulating layer 64.

A first top-surface insulating layer 65 is provided on a surface 151a of the second surface insulating layer 151 (or a first surface (a surface 62a of the circuit element layer 62) of the second top-surface insulating layer 151). The first top-surface insulating layer 65 includes an opening 131 to expose a second top-surface electrode 69. The first top-surface insulating layer 65 contains a different insulating material from that of the second top-surface insulating layer 151. For the first top-surface insulating layer 65, for example, polyimide resin is available. For example, the first top-surface insulating layer 65 is 3 μm in thickness.

A second back-surface insulating layer 66 covers a surface 64a of the first back-surface insulating layer 64 (or a surface of the first back-surface insulating layer 64 that is the opposite side from a surface that is in contact with the semiconductor substrate 61). The first top-surface insulating layer 65 and the second back-surface insulating layer 66 contain a resin. More specifically, the first top-surface insulating layer 65 and the second back-surface insulating layer 66 contain a thermosetting resin. The second back-surface insulating layer 66 includes the opening 131B, which is designed to expose the one-end portion 135A of the penetrating electrode 135 and the surrounding area thereof. Therefore, the one-end portion 135A of the penetrating electrode 135 and the surrounding area thereof are not covered with the second back-surface insulating layer 66.

As the second back-surface insulating layer 66, an insulating layer (resin layer) having a thermal-expansion coefficient that causes the difference between the thermal-expansion coefficients of the second back-surface insulating layer 66 and first top-surface resin layer 65 to be smaller than the difference between the thermal-expansion coefficients of the first back-surface insulating layer 64 and first top-surface resin layer 65 is employed.

In this manner, on the surface 64a, the second back-surface insulating layer 66 is provided in such a way that the difference between the thermal-expansion coefficients of the first top-surface insulating layer 65 and second back-surface insulating layer 66 is smaller than the difference between the thermal-expansion coefficients of the first back-surface insulating layer 64 and first top-surface insulating layer 65. As a result, compared with the conventional case, the difference in thermal-expansion coefficient between the top-surface side and back-surface side of a second semiconductor chip 36-1 can be made smaller. Therefore, even if the second semiconductor chip 36-1 is heated at a time when a first back-surface electrode 52 of a first semiconductor chip 35 is thermally and compressively bonded to a second top-surface electrode 69 of the second semiconductor chip 36-1 or at a time when a second back-surface electrode 71 of the second semiconductor chip 36-1 is thermally and compressively bonded to a second top-surface electrode 69 of a second semiconductor chip 36-2, it is possible to prevent warping of the second semiconductor chip 36-1.

It becomes possible to curb warping of the first and second semiconductor chips 35 and 36-1, which are attributable to heating and cooling during a thermo-compression bonding process. Therefore, the reliability of electrical connection between the first and second semiconductor chips 35 and 36-1 can be improved. If the first top-surface insulating layer 65 is 3 μm in thickness, the second back-surface insulating layer 66 may be 3 μm in thickness, for example.

The substrate through-hole 67 passes through the semiconductor substrate 61 that surrounded by the cylindrical insulating material 63; the first back-surface insulating layer 64 and second back-surface insulating layer 66 that face the semiconductor substrate 61 surrounded by the cylindrical insulating material 63; and the first interlayer insulating film 82.

The chip penetrating electrode 68 passes through the semiconductor substrate 61, the first back-surface insulating layer 64, and the second back-surface insulating layer 66. One end of the chip penetrating electrode 68 is exposed from the second back-surface insulating layer 66, and protrudes from the surface 66a of the second back-surface insulating layer 66. The other end is exposed through the opening 129.

The chip penetrating electrode 68 includes a penetrating electrode 135 (Si penetrating electrode); wiring layers 142, 144, and 147, which are electrically connected to the penetrating electrode 135; a contact plug 143; vias 146 and 148; and the first wiring layer 149.

The penetrating electrode 135 includes a seed layer 138 and a penetrating electrode body 139. The seed layer 138 covers the inner surface of the substrate through-hole 67, and the second surface 61b that is positioned in a formation area of the penetrating electrode body 139. As described above, the one-end portion 135A of the penetrating electrode 135 and the surrounding area thereof are not covered with the first and second back-surface insulating layers 64 and 66. Therefore, the first and second back-surface insulating layers 64 and 66 do not exist between the one-end portion 135A and the second surface 61b. An upper surface 138a (or the other end of the penetrating electrode 135) of the seed layer 138 is exposed from the first interlayer insulating film 82. For the seed layer 138, for example, a laminated film, which is made up of Ti and Cu films that are sequentially stacked, may be used.

The penetrating electrode body 139 is a Sipenetrating electrode (Through-Silicon Via, TSV). The penetrating electrode body 139 fills the substrate through-hole 67 through the seed layer 138. The penetrating electrode body 139 is made of metal (or more specifically, Cu). The penetrating electrode 135 includes the one-end portion 135A, which protrudes from the second surface 61b of the semiconductor substrate 61. The one-end portion 135A is formed directly on the second surface 61b of the semiconductor substrate 61.

In that manner, according to the present embodiment, the first and second back-surface insulating layers 64 and 66 does not exist between the second surface 61b and the one-end portion 135A, thereby achieving advantageous effects that are described later.

The second top-surface electrode 69 includes a seed layer 152 and a top-surface electrode body 153. The seed layer 152 is provided on an inner surface (side and bottom) of the opening 129, and on a surface 151a of the second top-surface insulating layer 151 corresponding to a formation area of the top-surface electrode body 153 (or on a first surface of the second top-surface insulating layer 151). The seed layer 152 on the bottom surface of the opening 129 is connected to the top surface 149a of the first wiring layer 149. In this manner, the second top-surface electrode 69 is electrically connected to the chip penetrating electrode 68. For the seed layer 152, for example, a laminated film, which is made up of Ti and Cu films that are sequentially stacked, may be used.

The top-surface electrode body 153 fills the opening 129 through the seed layer 152. The top-surface electrode body 153 protrudes from the surface of the first top-surface insulating layer 65. For example, Cu can be used to make the top-surface electrode body 153.

The second top-surface electrode 69 includes a first portion 69A, which passes through the second top-surface insulating layer 151 before reaching the first wiring layer 149. Between the first wiring layer 149 and the second top-surface electrode 69, a plurality of wiring layers that make up the multi-level wiring structure 87 are disposed. However, between the first wiring layer 149 and the second top-surface electrode 69, any one of a plurality of wiring layers that make up the multi-level wiring structure 87 is not inserted.

A solder bump 70 covers an upper surface 69b of the second top-surface electrode 69. For example, a Sn—Ag alloy may be used to make the solder bump 70. The second back-surface electrode 71 covers an end surface 139a (or the other end of the chip penetrating electrode 68) of the penetrating electrode body 139, which is exposed from the second back-surface insulating layer 66. That is, the second back-surface electrode 71 is disposed on the second surface 61b's side of the semiconductor substrate 61. For the second back-surface electrode 71, for example, a Ni/Au laminated film, which is made up of Ni and Au layers that are sequentially stacked, may be used.

Figure 5:
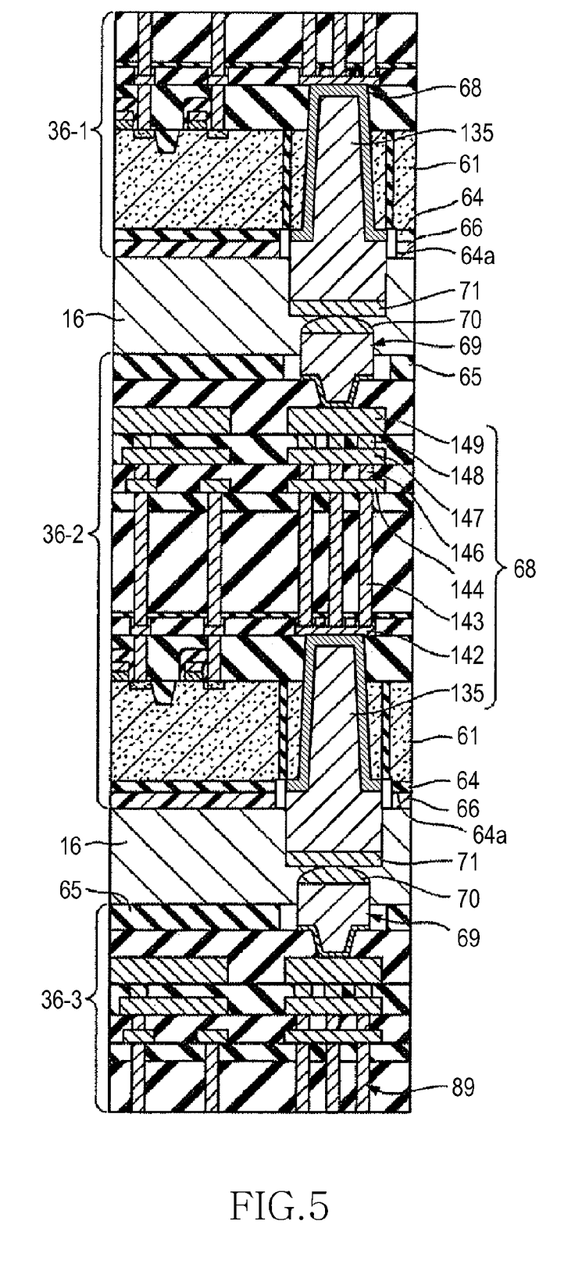
FIG. 5 is a detailed cross-sectional view of the semiconductor device shown in FIG. 1.

FIG. 5 is an enlarged cross-sectional view of a chip laminated body corresponding to the area C shown in FIG. 1. In FIG. 5, the same components as those of the second semiconductor chip 36-1 shown in FIG. 4 are represented by the same symbols.

As shown in FIG. 5, the second top-surface electrode 69 of the second semiconductor chip 36-2 is electrically connected to the second back-surface electrode 71 of the second semiconductor chip 36-1 via the solder bump 70. In this manner, the second semiconductor chip 36-2 is mounted on the second semiconductor chip 36-1, and is electrically connected to a wiring substrate 11. A gap is formed between the second semiconductor chip 36-1 and the second semiconductor chip 36-2. The gap is filled with a first sealing resin 16.

The second semiconductor chip 36-2 has the same configuration as the second semiconductor chip 36-1. Due to this configuration, the difference between the thermal-expansion coefficients of the first top-surface insulating layer 65 and second back-surface insulating layer 66 is smaller than the difference between the thermal-expansion coefficients of the first back-surface insulating layer 64 and first top-surface insulating layer 65. As a result, compared with the conventional case, the difference in thermal-expansion coefficient between the top-surface side and back-surface side of a second semiconductor chip 36-2 can be made smaller. Therefore, even if the second semiconductor chip 36-2 is heated at a time when the second semiconductor chips 36-1 and 36-2 are thermally and compressively bonded together or at a time when the second semiconductor chips 36-2 and 36-3 are thermally and compressively bonded together, it is possible to curb warping of the second semiconductor chip 36-2.

It becomes possible to curb warping of the first semiconductor chip 35 and the second semiconductor chips 36-1 and 36-2, which are attributable to heating and cooling during a thermo-compression bonding process. Therefore, the reliability of electrical connection between the second semiconductor chip 36-2 and the first and second semiconductor chips 35 and 36-1 can be improved.

The second top-surface electrode 69 of the second semiconductor chip 36-3 is electrically connected to the second back-surface electrode 71 of the second semiconductor chip 36-2 via the solder bump 70. In this manner, the second semiconductor chip 36-3 is mounted on the second semiconductor chip 36-2, and is electrically connected to the wiring substrate 11. A gap is formed between the second semiconductor chip 36-2 and the second semiconductor chip 36-3. The gap is filled with the first sealing resin 16.

The second semiconductor chip 36-3 has the same configuration as the second semiconductor chip 36-1. Therefore, on the surface 64a of the first back-surface insulating layer 64, the second back-surface insulating layer 66 is provided in such a way that the difference between the thermal-expansion coefficients of the first top-surface insulating layer 65 and second back-surface insulating layer 66 is smaller than the difference between the thermal-expansion coefficients of the first back-surface insulating layer 64 and first top-surface insulating layer 65. As a result, compared with the conventional case, the difference in thermal-expansion coefficient between the top-surface side and back-surface side of a second semiconductor chip 36-3 can be made smaller. Therefore, even if the second semiconductor chip 36-3 is heated at a time when the second semiconductor chips 36-3 and 36-2 are thermally and compressively bonded together or at a time when the second semiconductor chips 36-3 and 36-4 are thermally and compressively bonded together, it is possible to curb warping of the second semiconductor chip 36-3.

It becomes possible to curb warping of the second semiconductor chips 36-1, 36-2 and 36-3, which are attributable to heating and cooling during a thermo-compression bonding process. Therefore, the reliability of electrical connection between the second semiconductor chip 36-3 and the second semiconductor chips 36-2 and 36-4 can be improved.

The following describes a method of producing each semiconductor chip 10 described above in detail with reference to the accompanying drawings from FIGS. 6A to 6G.

Figure 6A:
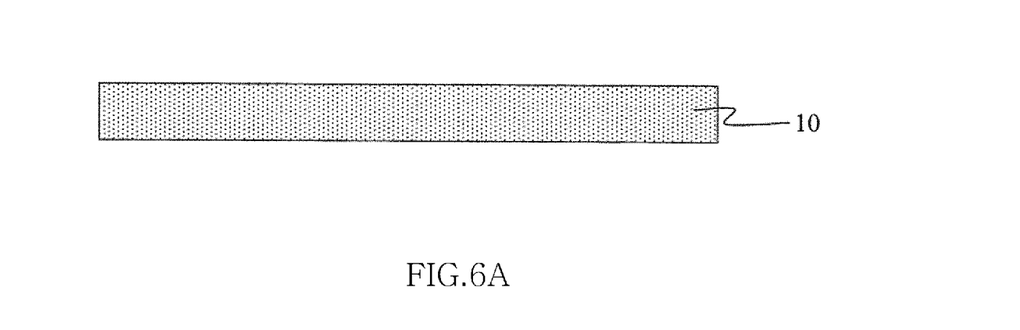
FIGS. 6A to 6G show a manufacturing process of one of the semiconductor chips shown in FIG. 1.
Figure 6B:
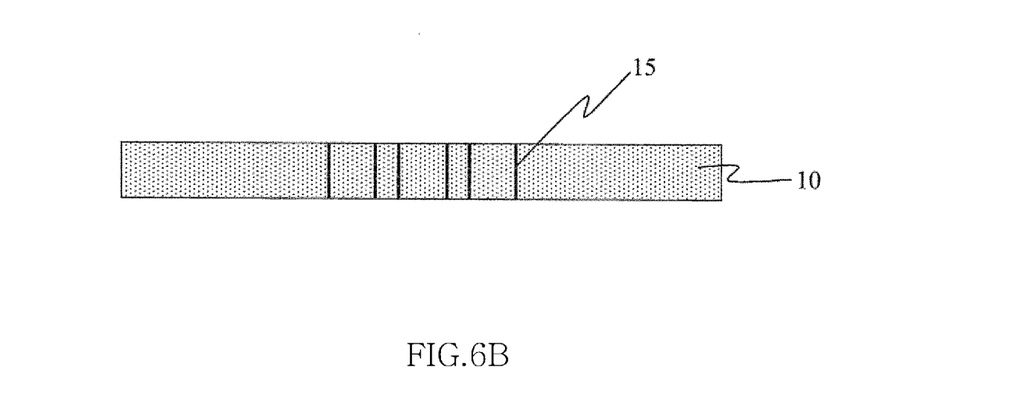
Figure 6C:
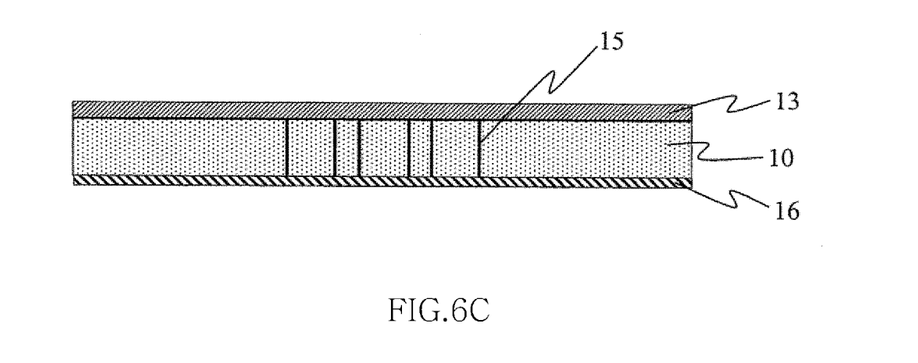
Figure 6D:
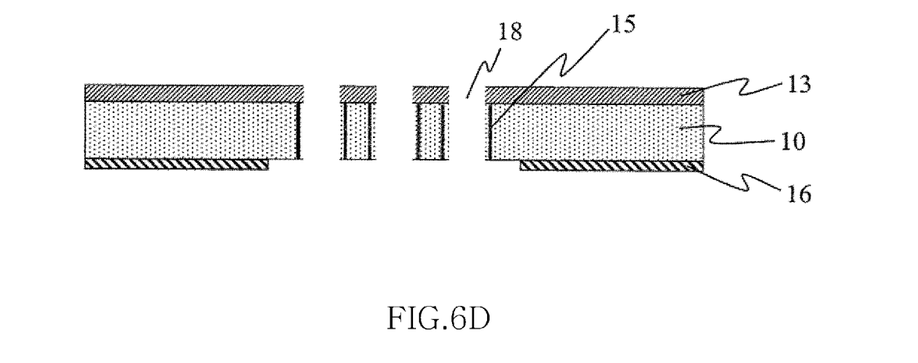
Figure 6E:
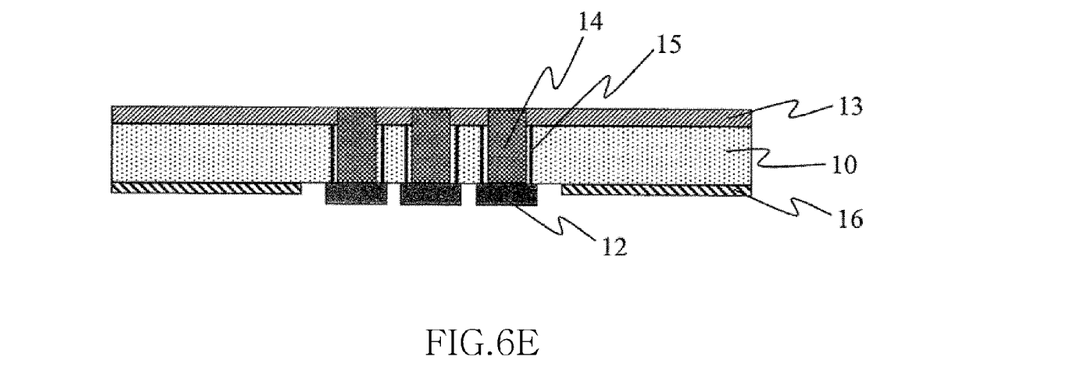
Figure 6F:
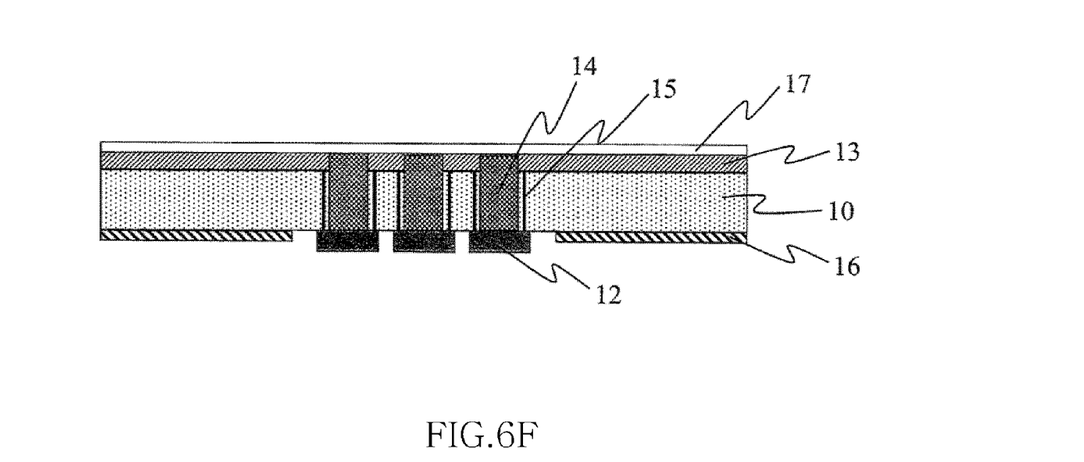
Figure 6G:
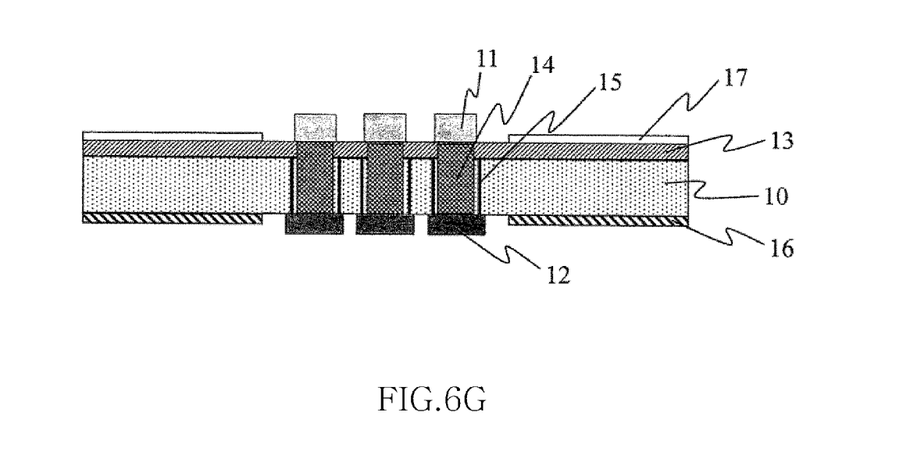

First, a semiconductor chip 10 (Si wafer) is prepared (FIG. 6A). On a surface thereof (the top surface of the chip shown in the diagram), a desired circuit element is formed. Then, after a resist film is formed on the surface, an etching process is carried out to form a ring-shaped groove in the above-described insulating ring placement area. Oxide silicon ($SiO_2$) is injected by CVD or the like into the groove (FIG. 6B). After that, a pattern section 13 is formed on the upper surface. The pattern section 13 includes a capacitor, wiring pattern, insulating film, and the like, which are formed by etching, CVD, and other techniques. On the back surface, a back-surface resin 16 that made of polyimide or the like is formed for example by spin coating (FIG. 6C). Then, the back-surface n around a penetrating electrode section is removed by etching, and through-holes 18 are formed (FIG. 6D). After that, penetrating electrodes 14 and lower bumps 12, which are positioned on the lower surfaces of the penetrating electrodes 14, are formed by plating method, CVD, and other methods (FIG. 6E). The penetrating electrodes 14 are made of copper (Cu) or the like, which is an excellent conductive material. Then, an insulating layer 17 that is made of polyimide or the like is formed for example by spin coating on the top of the pattern section (FIG. 6F). Only the insulating layer 17 around the penetrating electrode section is removed by etching or the like. After that, upper bumps 11 are formed by CVD or the like (FIG. 6G). The upper bumps 11 are made of Cu or the like, which is an excellent conductive material. In that manner, the semiconductor chip 10 is produced.

According to the present invention, as described above, in order to curb the warping of chips, which is caused by thermal stress during implementation process, as well as to improve the adhesion between the chips and the underfill that fills the gaps between the chips, on a lower section (back surface) of each semiconductor chip 10, the back-surface resin layer 16 that is made of polyimide or the like is disposed. The back-surface resin layer 16 is so formed as to be outside the lower bumps 12, which are formed on the lower surface of the penetrating electrodes 14. The reason will be described below.

Figure 7:
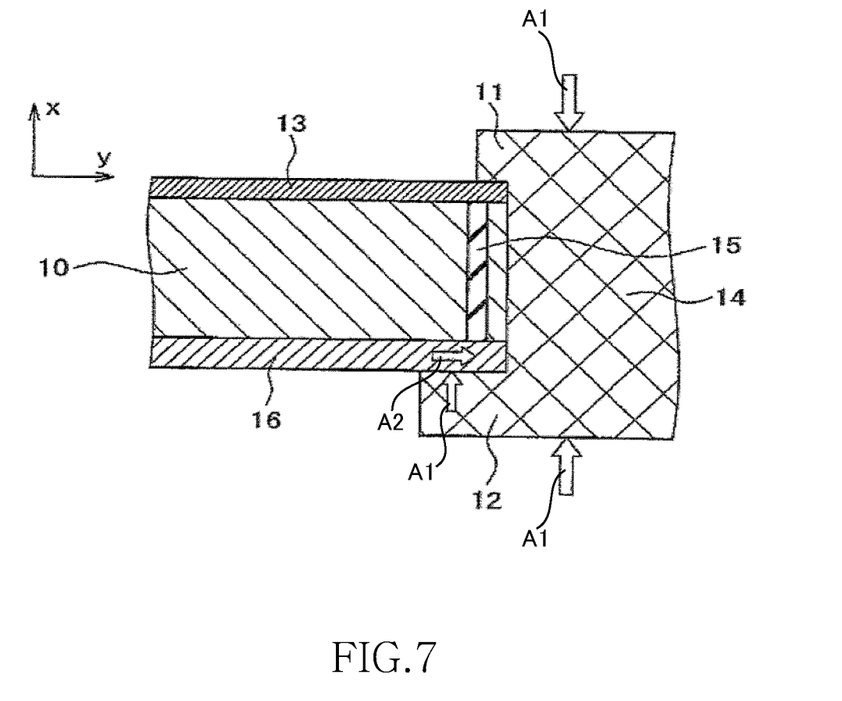
FIG. 7 is an enlarged cross-sectional view of a semiconductor chip that the inventors have conceived as a prototype in the course of making the present invention.

FIG. 7 shows the cross-section of the detailed structure of the semiconductor chip 10, which is a prototype that the present inventors came up with in the process of making the invention. Particularly in the prototype shown in FIG. 7, the back-surface resin layer 16 on the lower surface is separated from the lower bump 12, and is inserted into the lower bump 12. In other words, the lower bump 12 is stacked on the back-surface resin layer 16.

A plurality of semiconductor chips 10, which are prototypes of the above structure, are stacked and disposed in such a way that the lower bumps 12 of upper chips face the upper bumps 11 of lower chips, as shown in FIGS. 1 and 5. To make the chips electrically conductive, for example, a load is applied to the top of the chips, which are therefore bonded together.

Stress analysis by the inventors shows that large stress is applied to the penetrating electrode section a back-surface resin adjoining at a time when the chips are bonded together; and that, as a result, stress occurs in a way that cause plastic deformation of electrodes including the penetrating electrode 14.

That is, as a result of examining a cause of large stress that occurs at the penetrating electrode section of the back-surface resin adjoining at a time when the chips are bonded together, the inventors of the present invention found that the back-surface resin swells in an x-direction (the horizontal direction in the diagram) as the back-surface resin is compressed in a y-direction (the vertical direction of FIG. 7), and that the penetrating electrode 14 adjacent to the back-surface resin 16 is subjected to compressive stress from the adjoining back-surface resin 16.

More specifically, the above compressive stress is caused by crashing of the back-surface resin layer 16 between the lower bump 12 and the semiconductor chip 10, which is caused by a reaction force that emerges as a load is applied to the semiconductor chip stacked from the above, as indicated by arrow A1 in FIG. 7. That is, as indicated by arrow A2 in FIG. 7, the crashed and deformed back-surface resin layer 16 imposes stress on the above penetrating electrode 14. As a result, if there is a resin material on the back surface of the chip, large compressive stress is applied to the penetrating electrode section of the back-surface resin adjoining. As a result, the penetrating electrode is plastically deformed, resulting in a change in the position of the upper bump 11 relative to the position of the lower bump 12, and connection troubles between the chips.

The inventors found that a structure in which a back-surface resin is removed around a bump section is effective. That is, according to the present embodiment, a plurality of semiconductor chips are so stacked that the lower bumps 12 face the upper bumps 11. In order to prevent plastic deformation of the penetrating electrode even when the chips are bonded together, as well as to avoid positional changes and connection troubles between the above lower and upper bumps 12 and 11, i.e. to improve the adhesion between the chips and the underfill and reduce the warping of the chips, the back-surface resin layer 16 is so formed as to be outside the lower bump 12 without touching the lower bump 12 itself (at least without being inserted into the lower bump 12). According to the above structure, the back-surface resin helps to improve the adhesion between the chips and the underfill, curb the warping of the chips, and prevent positional changes and connection troubles between the lower and upper bumps 12 and 11.

What is claimed:

1. A semiconductor device comprising:
   a semiconductor substrate having a first surface on which a plurality of circuit elements are formed and a second surface opposite to the first surface;
   a first insulating layer provided over the first surface of the semiconductor substrate;
   a second insulating layer covering the second surface of the semiconductor substrate;
   a penetration electrode having a body section that penetrates through the semiconductor substrate and a protruding section that is connected to one end of the body section and protrudes from the second surface of the semiconductor substrate; and
   a bump electrode provided over the first surface of the semiconductor substrate, the bump electrode being electrically coupled to an other end of the penetration electrode,
   wherein the second surface of the semiconductor substrate is covered with the protruding section of the penetration electrode without intervention of the insulating layer, and
   wherein the first insulating layer is provided over the first surface of the semiconductor substrate so that the first insulating layer is apart from the bump electrode.

2. The semiconductor device as claimed in claim 1, wherein the protruding section of the penetration electrode has larger in diameter than the body section of the penetration electrode.

3. The semiconductor device as claimed in claim 1, wherein the second surface of the semiconductor substrate includes a first area covered with the second insulating layer and a second area covered with the protruding section of the penetration electrode.

4. The semiconductor device as claimed in claim 3, wherein the second surface of the semiconductor substrate further includes a third area between the first and second areas, the third area being covered with neither the second insulating layer nor the protruding section of the penetration electrode.

5. The semiconductor device as claimed in claim 4, wherein the third area of the second surface surrounds a plurality of the second areas.

6. The semiconductor device as claimed in claim 1, further comprising:
   a multi-level wiring structure formed on the first surface of the semiconductor substrate and connected to the other end of the body section of the penetration electrode,
   wherein the bump electrode is connected to the penetration electrode via the multi-level wiring structure.

7. The semiconductor device as claimed in claim 6, wherein the bump electrode is vertically aligned with the penetration electrode.

8. The semiconductor device as claimed in claim 6,
   wherein the first insulating layer covers the multi-level wiring structure, and
   wherein the second insulating layer and the first insulating layer comprise a resin.

9. The semiconductor device as claimed in claim 8, wherein the bump electrode protrudes from the first insulating layer.

10. A semiconductor device comprising:
    a semiconductor substrate having first and second surfaces opposite to each other;
    a penetration electrode penetrating through the semiconductor substrate between the first and second surfaces;
    a first bump electrode connected to one end of the penetration electrode;
    a second bump electrode connected to an other end of the penetration electrode;
    a first insulating layer; and
    a second insulating layer,
    wherein the first surface of the semiconductor substrate includes a first area surrounding the one end of the penetration electrode, a second area surrounding the first area and a third area surrounding the second area,
    the first area is covered with the first bump electrode,
    the third area is covered with the first insulating layer, and
    the second area is covered with neither the first bump electrode nor the first insulating layer, and
    wherein the second surface of the semiconductor substrate includes a fourth area surrounding the other end of the penetration electrode, a fifth area surrounding the fourth area and a sixth area surrounding the fifth area,
    the second bump electrode is provided over the fourth area,
    the second insulating layer is provided over the sixth area, and
    neither the second bump electrode nor the second insulating layer is provided over the fifth area.

11. The semiconductor device as claimed in claim 10, wherein the first area is covered with the first bump electrode without intervention of the first insulating layer.

12. The semiconductor device as claimed in claim 10, wherein a plurality of the penetration electrodes, the first bump electrodes and the second areas are provided, each of the second areas surrounding the first area covered with an associated one of the first bump electrodes.

13. The semiconductor device as claimed in claim 10, wherein a plurality of the penetration electrodes and the first bump electrodes are provided, the second area surrounding a plurality of the first areas each covered with an associated one of the first bump electrodes.

14. The semiconductor device as claimed in claim 10, further comprising:
    a multi-level wiring structure formed on the second surface of the semiconductor substrate and connected to the other end of the penetration electrode,
    wherein the second insulating layer covers the multi-level wiring structure, and
    wherein the second bump electrode is connected to the penetration electrode via the multi-level wiring structure, the second bump electrode protruding from the second insulating layer.

15. The semiconductor device as claimed in claim 14, wherein the first bump electrode is vertically aligned with the second bump electrode.

16. The semiconductor device as claimed in claim 14, wherein the first insulating layer and the second insulating layer comprise a resin.

17. A semiconductor device comprising:
    a semiconductor substrate including a first surface and a second surface opposite to the first surface;
    a penetration electrode penetrating from the first surface to the second surface;
    a first bump electrode provided over the first surface of the semiconductor substrate, the first bump electrode being electrically coupled to the penetration electrode;
    a first insulating layer provided over the first surface of the semiconductor substrate so that the first insulating layer is apart from the first bump electrode;

a second bump electrode provided over the second surface of the semiconductor substrate, the second bump electrode being electrically coupled to the penetration electrode; and a second insulating layer provided over the second surface of the semiconductor substrate so that the second insulating layer is apart from the second bump electrode.

18. The semiconductor device as claimed in claim 17, wherein each of the first and second bump electrodes is larger in width than the penetration electrode.

19. The semiconductor device as claimed in claim 17, wherein the first insulating layer is substantially equal in area to the second insulating layer.

20. The semiconductor device as claimed in claim 17, wherein each of the first and second bump electrodes is vertically aligned with the penetration electrode.

* * * * *